(12) United States Patent
Oda et al.

(10) Patent No.: US 11,019,740 B2
(45) Date of Patent: May 25, 2021

(54) ELECTRICAL CONNECTION BOX

(71) Applicants: Sumitomo Wiring Systems, Ltd., Yokkaichi (JP); Toyota Jidosha Kabushiki Kaisha, Toyota (JP)

(72) Inventors: Maiko Oda, Yokkaichi (JP); Kiyofumi Kawaguchi, Yokkaichi (JP); Nobutaka Suzuki, Yokkaichi (JP); Takenori Kobayashi, Toyota (JP)

(73) Assignees: Sumitomo Wiring Systems, Ltd., Yokkaichi (JP); Toyota Jidosha Kabushiki Kaisha, Toyota (JP)

( * ) Notice: Subject to any disclaimer, the term of this patent is extended or adjusted under 35 U.S.C. 154(b) by 63 days.

(21) Appl. No.: 16/582,026

(22) Filed: Sep. 25, 2019

(65) Prior Publication Data
US 2020/0113072 A1  Apr. 9, 2020

(30) Foreign Application Priority Data
Oct. 3, 2018  (JP) .............................. JP2018-188633

(51) Int. Cl.
*H05K 5/02* (2006.01)
*B60R 16/023* (2006.01)
*H05K 5/00* (2006.01)

(52) U.S. Cl.
CPC ....... *H05K 5/0217* (2013.01); *B60R 16/0239* (2013.01); *H05K 5/0008* (2013.01); *H05K 5/0247* (2013.01)

(58) Field of Classification Search
None
See application file for complete search history.

(56) References Cited

U.S. PATENT DOCUMENTS

| 7,586,038 | B2 * | 9/2009 | Kanamaru | H02G 3/083 174/489 |
| 8,424,698 | B2 * | 4/2013 | I | H02G 3/14 220/3.8 |
| 8,537,565 | B2 * | 9/2013 | Miyamoto | B60R 16/0239 361/807 |

(Continued)

FOREIGN PATENT DOCUMENTS

| CN | 1578037 A | 2/2005 |
| CN | 101868869 A | 10/2010 |

(Continued)

OTHER PUBLICATIONS

First Chinese Office Action, Application No. 201910885108.6, dated Aug. 19, 2020.

*Primary Examiner* — Xanthia C Cunningham
(74) *Attorney, Agent, or Firm* — Honigman LLP

(57) ABSTRACT

An electrical connection box mounted on a vehicle and used for connecting a plurality of on-board loads to an on-board power supply, comprising: a box main body that is provided with an opening at a side and that accommodates an electrical component for the connecting; a cover body that covers the opening and that is provided with a protrusion portion protruding outward beyond the opening; an insertion hole that is provided a side wall of the box main body and that allows for insertion of an electric wire to be connected to the electrical component; and an extension portion that extends outward from a portion of the protrusion portion corresponding to the insertion hole and that bends arcuately.

3 Claims, 5 Drawing Sheets

(56) References Cited

U.S. PATENT DOCUMENTS

| | | | | |
|---|---|---|---|---|
| 9,077,019 | B2* | 7/2015 | Kosaki | H01M 10/625 |
| 9,758,029 | B2* | 9/2017 | Hokazono | B60K 1/04 |
| 10,118,475 | B2* | 11/2018 | Sugizaki | B60K 1/04 |
| 10,148,074 | B1* | 12/2018 | Matsumura | H02G 3/083 |
| 10,305,267 | B2* | 5/2019 | Kawada | H02G 3/081 |
| 10,343,548 | B2* | 7/2019 | Yokoyama | H01M 10/6563 |
| 10,431,791 | B2* | 10/2019 | Lomax | B60K 1/04 |
| 2003/0000726 | A1 | 1/2003 | Miyakoshi | |
| 2008/0053699 | A1* | 3/2008 | Nakayama | B60R 16/0239 |
| | | | | 174/532 |
| 2010/0273040 | A1* | 10/2010 | Kubota | H01M 10/667 |
| | | | | 429/100 |
| 2010/0294580 | A1* | 11/2010 | Kubota | H01M 10/6565 |
| | | | | 180/68.1 |
| 2015/0343971 | A1* | 12/2015 | Ikeda | B60R 16/04 |
| | | | | 429/100 |
| 2017/0311460 | A1 | 10/2017 | Ozaki | |
| 2019/0081292 | A1* | 3/2019 | Shimizu | H01M 2/1077 |

FOREIGN PATENT DOCUMENTS

| | | |
|---|---|---|
| CN | 207559288 U | 6/2018 |
| JP | S57140796 U | 9/1982 |
| JP | 2000-36678 A | 2/2000 |
| JP | 2004-186039 A | 7/2004 |
| JP | 2006-74893 A | 3/2006 |
| JP | 2007-318898 A | 12/2007 |
| JP | 2013226019 A | 10/2013 |
| JP | 2017-200269 A | 11/2017 |
| JP | 2017212848 A | 11/2017 |

* cited by examiner

ELECTRICAL CONNECTION BOX

CROSS-REFERENCE TO RELATED APPLICATION

This Non-provisional application claims priority of Japanese Patent application No. JP 2018-188633 filed on Oct. 3, 2018, the entire contents of which are hereby incorporated by reference.

FIELD

The present disclosure relates to an electrical connection box.

BACKGROUND

A vehicle is mounted with an electrical connection box (Japanese Patent Application Laid-Open Publication No. 2017-200269) used for connecting multiple on-board loads to an on-board power supply. The on-board loads are on-board devices such as lamps, wipers, motors or the like. The electrical connection box has a box main body with an opening at the upper side for accommodating an electrical component and a cover body covering the opening. The box main body is provided with an insertion hole for an electric wire through which an electric wire is inserted and electrically connected to the electrical component.

SUMMARY

If, however, the cover has a protrusion portion protruding from the periphery of the opening of the cover body, a part of the electric wire corresponding to the protrusion portion may be bent downward due to an impact caused by an unexpected external force, which may damage the electric wire passing through the insertion hole.

It is an object of the present disclosure to provide an electrical connection box capable of preventing damage to the wire.

An electrical connection box according to an aspect of the present disclosure is an electrical connection box mounted on a vehicle and used for connecting a plurality of on-board loads to an on-board power supply and comprises: a box main body that is provided with an opening at an upper side and that accommodates an electrical component for the connecting; a cover body that is provided with a protrusion portion protruding from a periphery of the opening and that covers the opening; an insertion hole that is provided through a side wall of the box main body and that allows for insertion of an electric wire to be connected to the electrical component; and an extension portion that extends outward from a portion of the protrusion portion corresponding to the insertion hole and that bends arcuately upward.

According to the above description, it is possible to prevent damage to the electric wire.

The above and further objects and features will more fully be apparent from the following detailed description with accompanying drawings.

DETAILED DESCRIPTION OF PREFERRED EMBODIMENTS

Embodiments of the present disclosure are listed and described. Here, at least parts of the embodiments described below may arbitrarily be combined.

An electrical connection box according to an aspect of the present disclosure is an electrical connection box mounted on a vehicle and used for connecting a plurality of on-board loads to an on-board power supply and comprises: a box main body that is provided with an opening at an upper side and that accommodates an electrical component for the connecting; a cover body that is provided with a protrusion portion protruding from a periphery of the opening and that covers the opening; an insertion hole that is provided through a side wall of the box main body and that allows for insertion of an electric wire to be connected to the electrical component; and an extension portion that extends outward from a portion of the protrusion portion corresponding to the insertion hole and that bends arcuately upward.

In the present aspect, the extension end of the extension portion is positioned upward, which can prevent the end surface of the extension portion from contacting the electric wire even if the extension portion is bent downward. Moreover, the base end of the extension portion is arcuate, which allows the arcuate portion to contact the electric wire if the extension portion is bent downward.

This makes it possible to prevent damage to the electric wire.

In the electrical connection box according to one aspect of the present disclosure, the extension portion is folded toward an upper surface of the cover body.

In the present aspect, the extension end of the extension portion is not oriented upward, which prevents the fingertips of a worker who engages in installation work or the like of the electrical connection box into the vehicle from abutting against the end surface of the extension portion and improves operability.

In the electrical connection box according to one aspect of the present disclosure, an extension end of the extension portion is in contact with the upper surface of the cover body.

In the present aspect, no clearance is formed between the extension end of the extension portion and the upper surface of the cover body, which prevents the fingertips of a worker who engages in installation work or the like of the electrical connection box into the vehicle from abutting against the end surface of the extension portion and improves operability.

Embodiment 1

The present disclosure will be described in detail below with reference to the drawings of the embodiment.

Figure 1:
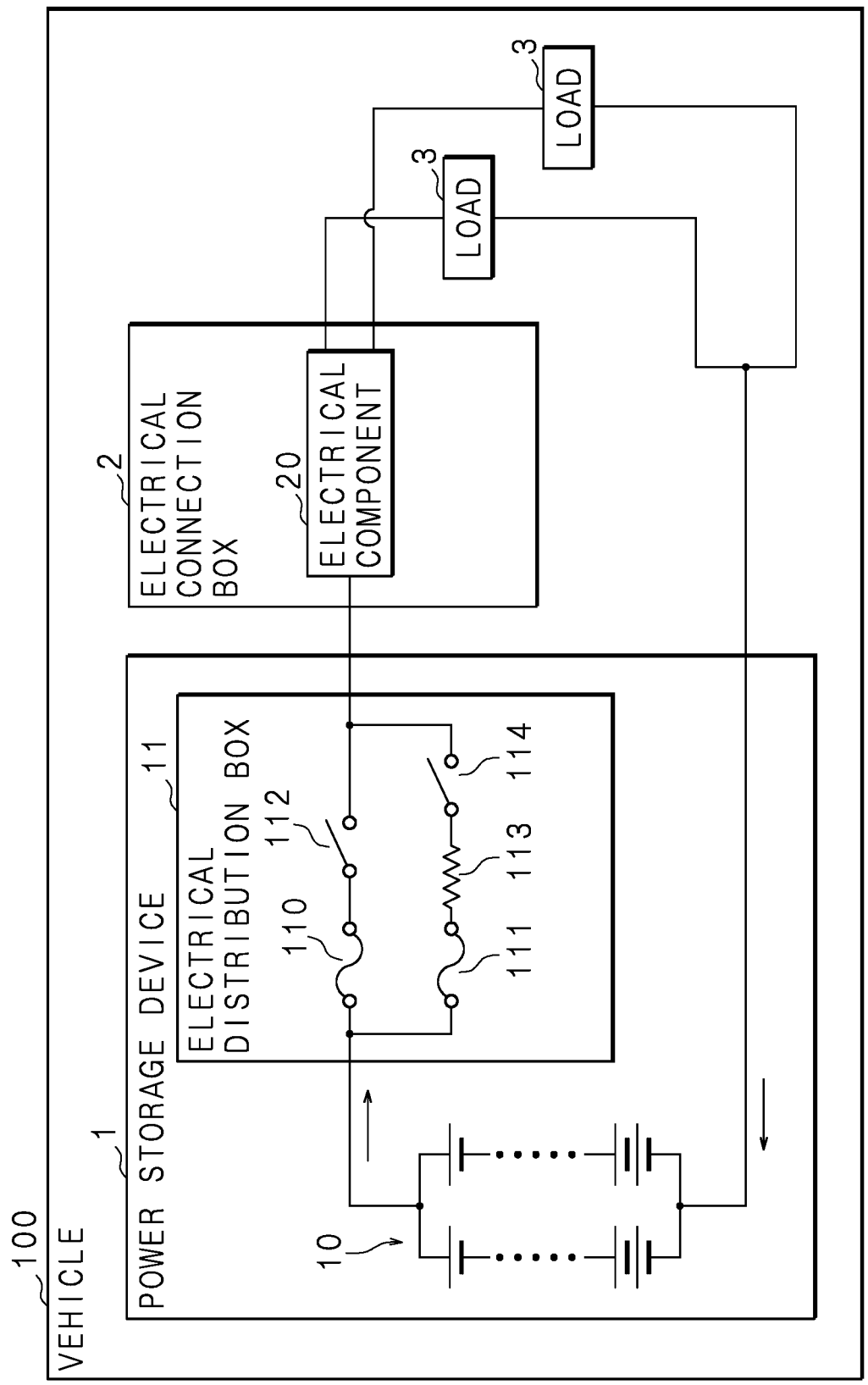
FIG. 1 is a block diagram illustrating the configuration of an electrical distribution system of a vehicle provided with an electrical connection box according to Embodiment 1.

FIG. 1 is a block diagram illustrating the configuration of an electrical distribution system of a vehicle provided with an electrical connection box according to Embodiment 1. The reference numeral 100 in the drawing represents a vehicle, and the vehicle 100 includes a power storage device 1, an electrical connection box 2 connected to the power storage device 1 through an electric wire such as a wire harness or the like and multiple loads 3 (two in the drawing) connected to the electrical connection box 2 through an electric wire such as a wire harness or the like. The power storage device 1 is disposed in an engine compartment, for example, while the electrical connection box 2 is disposed in a luggage room, for example.

The power storage device 1 includes a storage battery 10 and an electrical distribution box 11. The storage battery 10 is, for example, a lithium battery and a secondary battery including battery cells connected in series-parallel manner.

The electrical distribution box 11 is a so-called junction box for distributing power from the storage battery 10 to each of the on-board loads. The electrical distribution box 11 has multiple systems for distributing power to each of the on-board loads. Note that only the system for supplying power to the electrical connection box 2 is illustrated in FIG. 1 while the other systems are not illustrated here.

The electrical distribution box 11 includes two fuses 110 and 111, a switch 112, a resistor 113, a switch 114 and so on that constitute one system inside a housing (not illustrated) made waterproof by a seal member. The first ends of the fuses 110 and 111 are connected in parallel to the cathode of the storage battery. The second end of the fuse 110 is connected to the first end of the switch 112. The second end of the fuse 111 is connected to the first end of the switch 114 via the resistor 113. The second ends of the switches 112 and 114 are connected to the electrical connection box 2. The switches 112 and 114 are normally-open contacts, for example, and are selectively turned on in response to an operation instruction from an electronic control unit (ECU) (not illustrated).

The electrical connection box 2 distributes and supplies power supplied from the electrical distribution box 11 to the multiple loads 3. The electrical connection box 2 has an electrical component 20 connected to the switches 112 and 114 in the electrical distribution box 11 and the loads 3 through the wire such as a wire harness or the like. The electrical component 20 includes a fuse, a bus bar or the like. The loads 3 include on-board devices such as lamps, wipers, motors or the like. The first ends of the loads 3 are connected to the electrical component 20 whereas the second ends thereof are connected to the anode of the storage battery 10.

In the configuration described above, current flows from the cathode of the storage battery 10 through the electrical distribution box 11 and the electrical connection box 2 to the loads 3 as illustrated in the arrows in the drawing and returns to the anode of the storage battery 10.

When the load 3 is activated, the switch 114 is turned on. This causes current to flow in the resistor 113 side, which reduces rush current. The switch 114 is then turned off while the switch 112 is turned on, which causes current to flow in the load 3. The fuses 110 and 111 can interrupt power supply to the electrical connection box 2 and the loads 3 if current equal to or larger than a predetermined current value flows. In the electrical connection box 2, by the electrical component 20, current is supplied to each of the loads 3.

Figure 2:
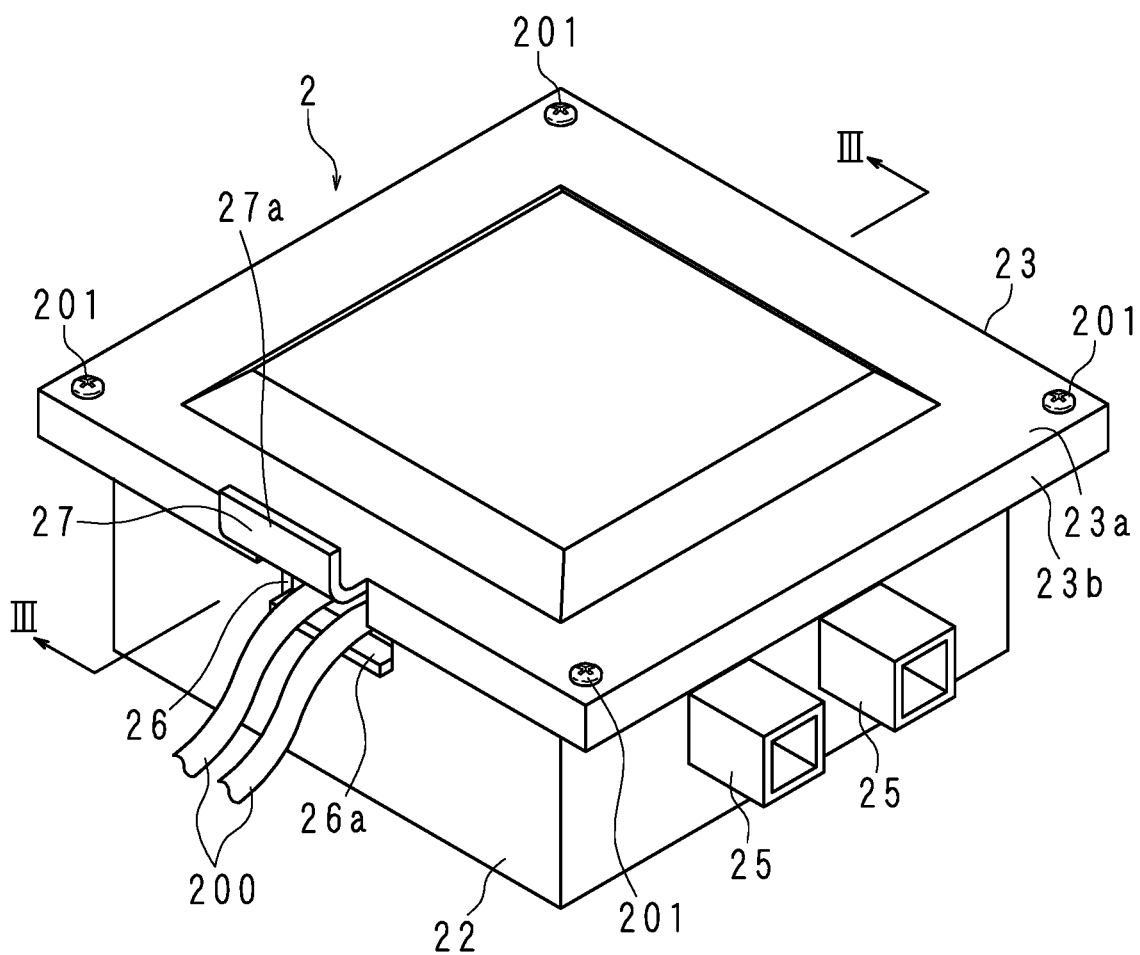
FIG. 2 is an external perspective view of the electrical connection box.
Figure 3:
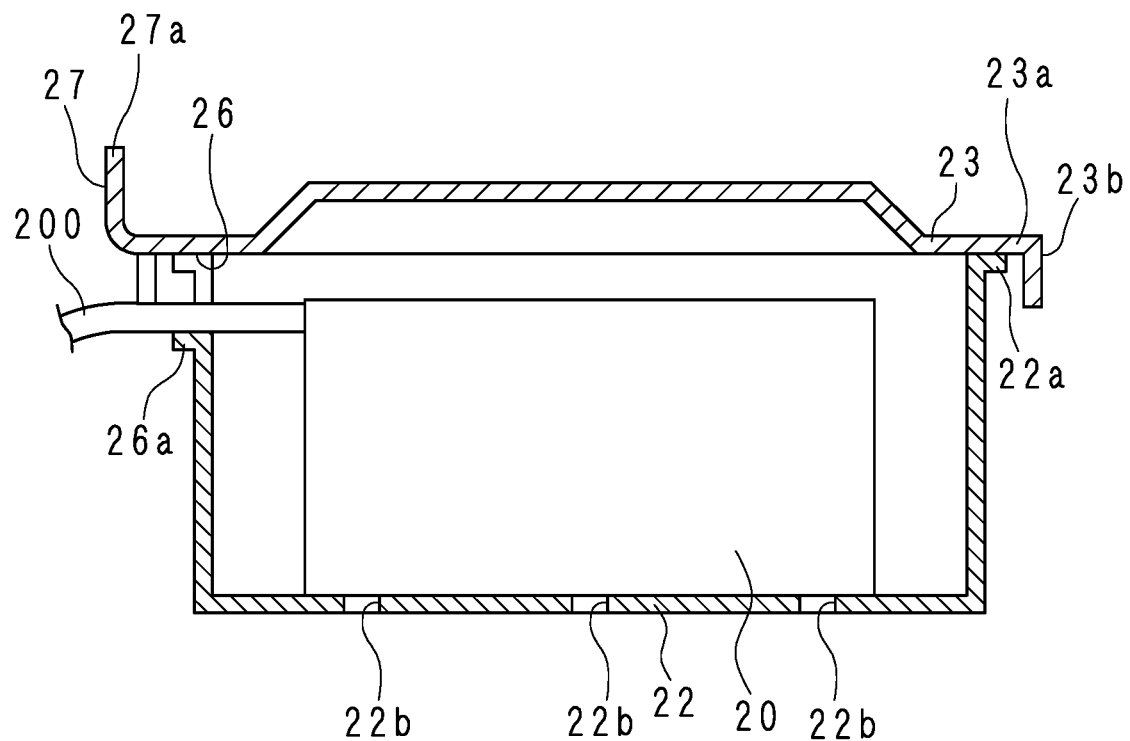
FIG. 3 is a cross-sectional view of the electrical connection box taken along line III-III in FIG. 2.

FIG. 2 is an external perspective view of the electrical connection box 2. FIG. 3 is a cross-sectional view of the electrical connection box 2 taken along line in FIG. 2. The electrical connection box 2 has a rectangular parallelepiped box main body 22 having one open surface and a cover body 23 covering the opening of the box main body 22. The box main body 22 is mounted on the vehicle 100 while turning the open surface covered by the cover body 23 upward.

The box main body 22 accommodates the electrical component 20. The box main body 22 has one side wall with an insertion hole 26 through which the wire harness 200 is inserted.

The insertion hole 26 is provided at the upper part of the one side wall and has an elongated rectangular shape.

The box main body 22 has other side wall on which two connectors 25 are installed in a protruding manner. Through the connectors 25, the electrical component 20 is connected to an electric wire (not illustrated). The number of the connectors 25 is not limited to the illustrated number and may be provided in correspondence with the number of electric wires to be connected.

The insertion hole 26 is provided with a flange portion 26a projecting outward at the lower periphery thereof. Furthermore, at the periphery of the opening of the box main body 22 except for the insertion hole 26, a flange portion 22a projecting outward along the opening is provided.

The cover body 23 has a rectangular board shape and has external dimensions larger than those of the opening of the box main body 22. The cover body 23 has a protrusion portion 23a protruding from the periphery of the opening at the peripheral portion. At the central portion of one of the sides of the cover body 23, an extension portion 27 is provided.

The extension portion 27 extends outward from the central portion of the one side of the protrusion portion 23a and bends upward arcuately. The extension portion 27 extends substantially vertical to the upper surface of the cover body 23. The base end of the extension portion 27 is arcuately bent. The extension portion 27 can prevent liquid flowing downward from the upper side of the cover body 23 from entering the interior of the box main body 22 through the insertion hole 26.

At the peripheral portion of the cover body 23, an elongation portion 23b elongated downward at a part except for the extension portion 27 is provided. The cover body 23 is placed on the box main body 22 and secured at the four corners by screws 201 such that the extension portion 27 is aligned with the insertion hole 26, and the bottom surface of the cover body 23 is made abut against the flange portion 22a of the box main body 22. The elongation portion 23b is spaced apart and opposite to the gap between the cover body 23 and the flange portion 22b, and the elongation portion 23b prevents water from flowing along the bottom surface of the cover body 23 and entering through the gap between the cover body 23 and the box main body 22.

The upper surface of the cover body 23 is raised except for the peripheral portion. This makes it possible to flow liquid outward if the liquid flows from the upper side.

As illustrated in FIG. 3, on the bottom wall of the box main body 22, multiple holes 22b are provided in a penetrated manner in the direction of thickness. The holes 22b allow liquid inside the electrical connection box 2 to be discharged even if water enters the interior of the electrical connection box 2.

As described above, the extension end 27a of the extension portion 27 is positioned upward, which can prevent the end surface of the extension portion 27 from contacting the electric wire even if the extension portion 27 is bent downward by an unexpected external force. Moreover, the base end of the extension portion 27 is arcuate, which allows the arcuate portion to contact the wire harness 200 if the extension portion 27 is bent downward. This makes it possible to prevent damage to the wire harness 200.

Furthermore, mere bending of the extension portion 27 to be substantially vertical to the upper surface of the cover body 23 enables easy production and cost reduction.

Note that the insertion hole 26 may be provided at a middle portion in the upper and lower direction of the side wall of the box main body 22.

Embodiment 2

Figure 4:
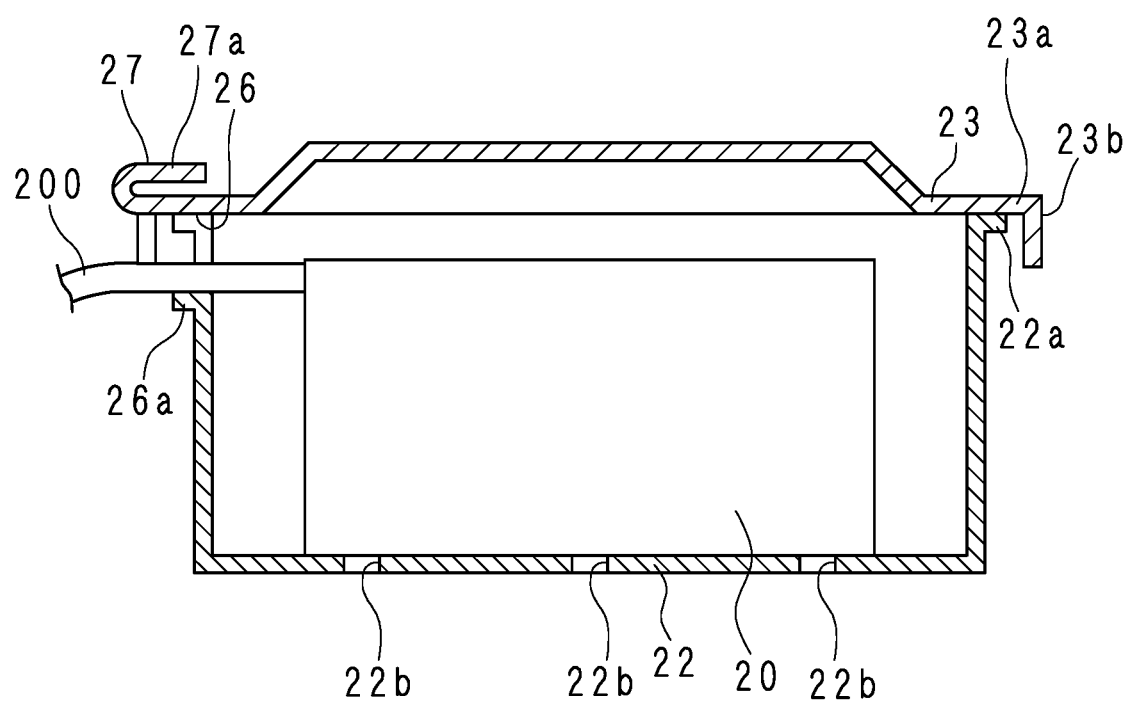
FIG. 4 is a cross-sectional view of an electrical connection box according to Embodiment 2.

Embodiment 2 is different from Embodiment 1 in the shape of the extension portion. FIG. 4 is a cross-sectional view of an electrical connection box according to Embodiment 2. An extension portion 27 according to Embodiment 2 is folded back to the upper surface side of the cover body 23. The extension end 27a of the extension portion 27 extends in parallel with the upper surface of the cover body 23, not upward. Furthermore, the base end of the extension portion 27 is arcuate similarly to Embodiment 1.

This configuration can prevent the end surface of the extension end 27a from contacting the electric wire even if the extension portion 27 is bent downward, similarly to Embodiment 1.

Moreover, the base end of the extension portion 27 is arcuate, which allows the arcuate portion to contact the wire harness 200 if the extension portion 27 is bent downward. This makes it possible to prevent damage to the wire harness 200.

Additionally, the extension end 27a of the extension portion 27 is not oriented upward, which prevents the fingertips of a worker who engages in installation work or the like of the electrical connection box 2 into the vehicle 100 from abutting against the end surface of the extension portion 27 and improves operability.

Embodiment 3

Figure 5:
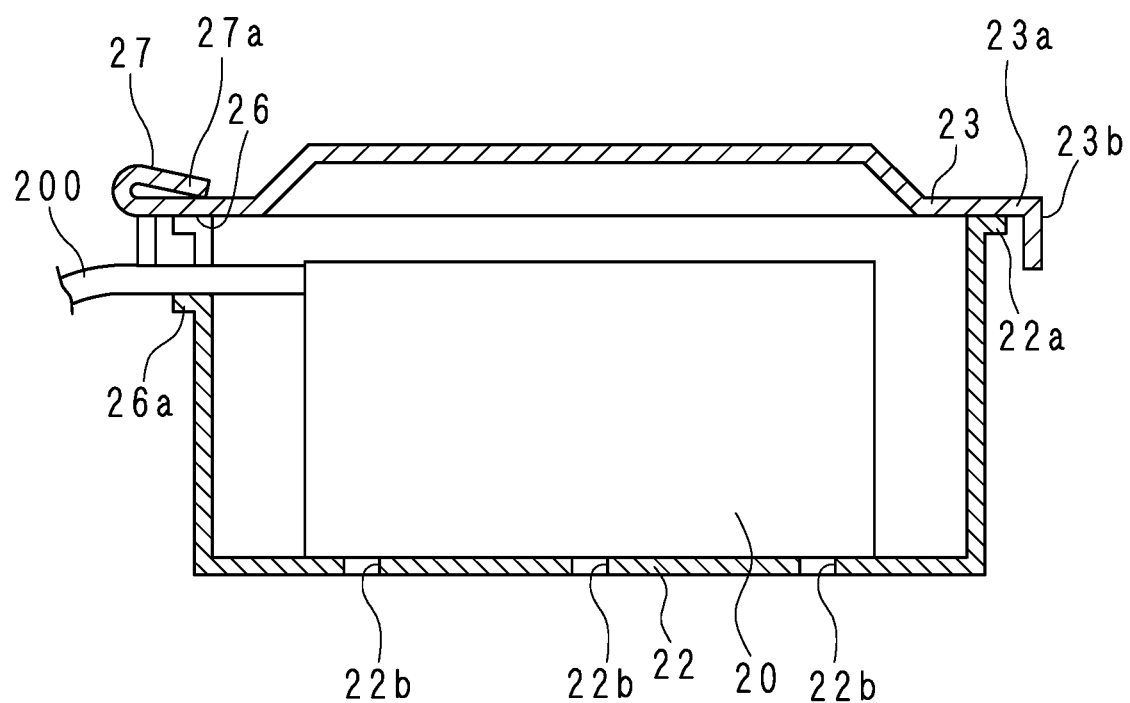
FIG. 5 is a cross-sectional view of an electrical connection box according to Embodiment 3.

Embodiment 3 is different from Embodiments 1 and 2 except for the shape of the extension portion. FIG. 5 is a cross-sectional view of an electrical connection box according to Embodiment 3.

An extension portion 27 according to Embodiment 3 is folded back to the upper surface side of the cover body 23 in such a manner that the extension end 27a is in contact with the upper surface of the cover body 23. Furthermore, the base end of the extension portion 27 is arcuate similarly to Embodiment 1.

This configuration can prevent the end surface of the extension end 27a from contacting the electric wire even if the extension portion 27 is bent downward, similarly to Embodiment 1.

Moreover, the base end of the extension portion 27 is arcuate, which allows the arcuate portion to contact the wire harness 200 if the extension portion 27 is bent downward. This makes it possible to prevent damage to the wire harness 200.

Additionally, the extension end 27a of the extension portion 27 is not oriented upward, which prevents the fingertips of a worker who engages in installation work or the like of the electrical connection box 2 into the vehicle 100 from abutting against the end surface of the extension end 27a and improves operability.

It is to be understood that the embodiments disclosed here is illustrative in all respects and not restrictive. The scope of the present disclosure is defined by the appended claims, and all changes that fall within the meanings and the bounds of the claims, or equivalence of such meanings and bounds are intended to be embraced by the claims.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present disclosure is defined by the appended claims rather than by the description preceding them, and all changes that fall within metes and bounds of the claims, or equivalence of such metes and bounds thereof are therefore intended to be embraced by the claims.

What is claimed is:

1. An electrical connection box mounted on a vehicle and used for connecting a plurality of on-board loads to an on-board power supply, comprising:
    a box main body that is provided with an opening at a side and that accommodates an electrical component for the connecting;
    a cover body that covers the opening and that is provided with a protrusion portion protruding outward beyond the opening;
    an insertion hole that is provided a wall of the box main body and that allows for insertion of an electric wire to be connected to the electrical component; and
    an extension portion that extends outward from a portion of the protrusion portion corresponding to the insertion hole and that bends arcuately.

2. The electrical connection box according to claim 1, wherein the extension portion is folded toward an upper surface of the cover body.

3. The electrical connection box according to claim 1, wherein an extension end of the extension portion is in contact with an upper surface of the cover body.

* * * * *